(12) United States Patent
Annunziata et al.

(10) Patent No.: US 9,536,925 B1
(45) Date of Patent: Jan. 3, 2017

(54) INJECTION PILLAR DEFINITION FOR LINE MRAM BY A SELF-ALIGNED SIDEWALL TRANSFER

(71) Applicant: International Business Machines Corporation, Armonk, NY (US)

(72) Inventors: Anthony J. Annunziata, Stamford, CT (US); Joel D. Chudow, Bronx, NY (US); Michael C. Gaidis, Wappingers Falls, NY (US); Rohit Kilaru, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/920,538

(22) Filed: Oct. 22, 2015

Related U.S. Application Data

(62) Division of application No. 14/753,163, filed on Jun. 29, 2015, now Pat. No. 9,299,924.

(51) Int. Cl.
| | | |
|---|---|---|
| *H01L 43/02* | (2006.01) | |
| *H01L 43/08* | (2006.01) | |
| *H01L 43/12* | (2006.01) | |
| *H01L 27/22* | (2006.01) | |
| *G11C 11/16* | (2006.01) | |

(52) U.S. Cl.
CPC .......... *H01L 27/222* (2013.01); *G11C 11/161* (2013.01); *H01L 43/02* (2013.01); *H01L 43/08* (2013.01)

(58) Field of Classification Search
CPC .......... H01L 43/02; H01L 43/08; H01L 43/12; H01L 27/222
See application file for complete search history.

(56) References Cited

U.S. PATENT DOCUMENTS

| | | | | |
|---|---|---|---|---|
| 2011/0278528 A1* | 11/2011 | Lung | ................... | H01L 27/2454 257/2 |
| 2011/0305074 A1* | 12/2011 | Lung | ................... | H01L 27/2445 365/163 |
| 2012/0267597 A1* | 10/2012 | Lung | ...................... | H01L 45/06 257/4 |
| 2012/0315737 A1* | 12/2012 | Kang | ...................... | H01L 45/06 438/381 |

* cited by examiner

*Primary Examiner* — Fazli Erdem
(74) *Attorney, Agent, or Firm* — Cantor Colburn LLP; Vazken Alexanian

(57) ABSTRACT

A technique relates to an MRAM system. A conformal film covers trenches formed in an upper material. The upper material covers conductive islands in a substrate. The conformal film is selectively etched to leave sidewalls on the trenches. The sidewalls are etched into vertical columns self-aligned to and directly on top of the conductive islands below. A filling material is deposited and planarized to leave exposed tops of the vertical columns. An MTJ element is formed on top of the filling material and exposed tops of the vertical columns. The MTJ element is patterned into lines corresponding to the vertical columns, and each of the lines has a line MTJ element self-aligned to one of the vertical columns. Line MRAM devices are formed by patterning the MTJ element into the lines. Each of line MRAM devices respectively include the line MTJ element self-aligned to the one of the vertical columns.

20 Claims, 14 Drawing Sheets

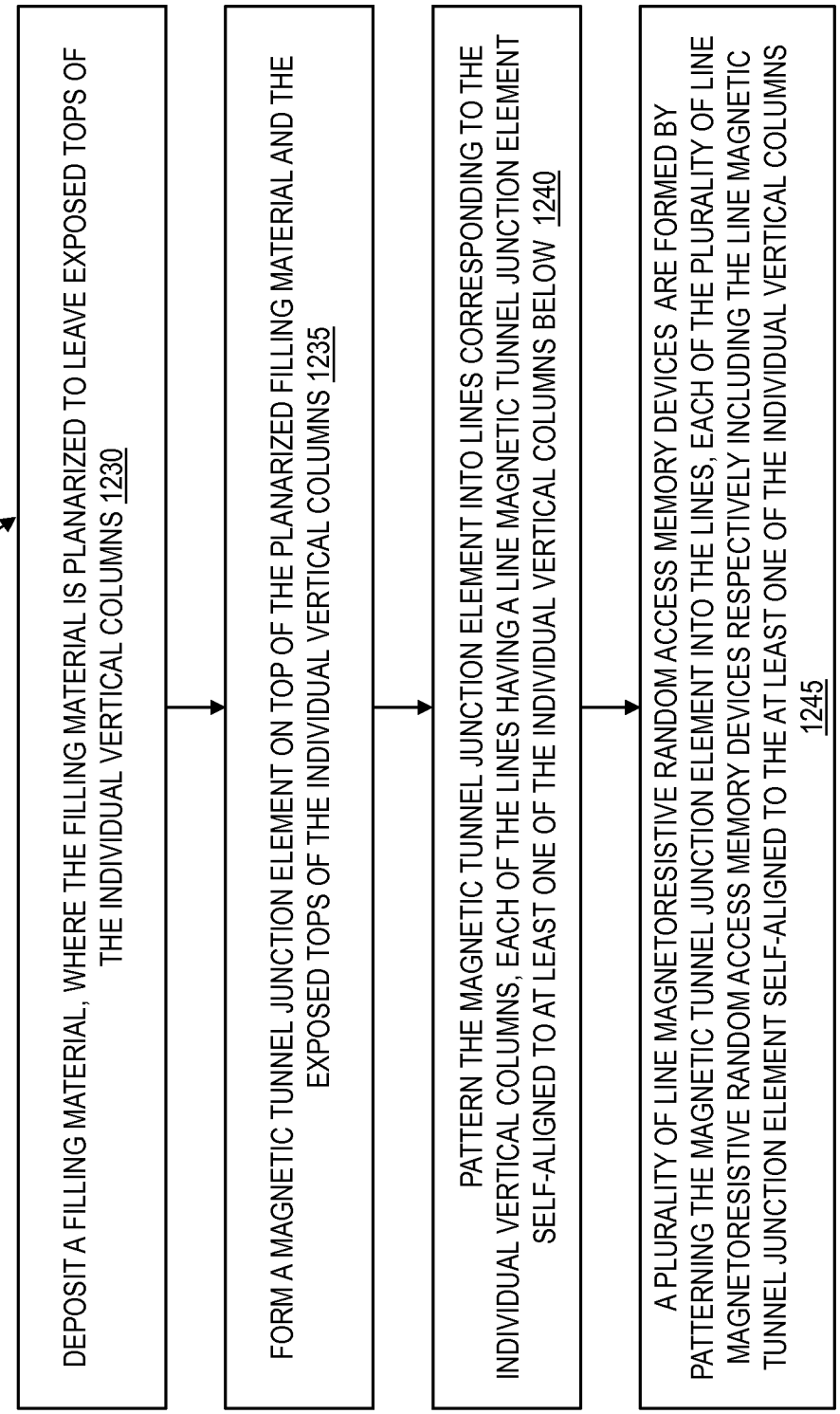

US 9,536,925 B1

INJECTION PILLAR DEFINITION FOR LINE MRAM BY A SELF-ALIGNED SIDEWALL TRANSFER

DOMESTIC PRIORITY

This application is a divisional of U.S. patent application Ser. No. 14/753,163, filed Jun. 29, 2015, the disclosure of which is incorporated by reference herein in its entirety.

BACKGROUND

The present invention relates to magnetic memory and magnetic storage devices, and more specifically, to injection pillar definition for line magnetoresistive random access memory devices (MRAM) by self-aligned sidewall transfer.

Unlike conventional RAM chip technologies, data in MRAM is not stored as electric charge or current flows, but by magnetic storage elements. The magnetic storage elements are formed from two ferromagnetic plates, each of which can hold a magnetization, separated by a thin insulating layer. One of the two ferromagnetic plates is a permanent magnet set to a particular polarity, while the other plate has a magnetization that can be changed to match that of an external field to store memory. This configuration is known as a spin valve and is the simplest structure for an MRAM bit/cell. A memory device is built from a grid of such cells.

SUMMARY

According to one embodiment, a method of forming a line magnetoresistive random access memory (MRAM) system is provided. The method includes forming conductive islands in a substrate such that an upper layer material covers both the substrate and the conductive islands, forming trenches in the upper layer material such that the trenches expose tops of the conductive islands below, and depositing a conformal thin film all over peaks and valleys of the trenches. The method includes selectively etching the conformal thin film to leave sidewalls of the conformal thin film remaining on the trenches, and selectively etching the sidewalls into individual vertical columns of the conformal thin film, such that the individual vertical columns are self-aligned to and directly on top of the conductive islands below. Also, the method includes depositing a filling material, where the filling material is planarized to leave exposed tops of the individual vertical columns, forming a magnetic tunnel junction element on top of the planarized filling material and the exposed tops of the individual vertical columns, and patterning the magnetic tunnel junction element into lines corresponding to the individual vertical columns. Each of the lines has a line magnetic tunnel junction element self-aligned to at least one of the individual vertical columns below. A plurality of line magnetoresistive random access memory devices are formed by patterning the magnetic tunnel junction element into the lines, and each of the plurality of line magnetoresistive random access memory devices respectively includes the line magnetic tunnel junction element self-aligned to the at least one of the individual vertical columns.

According to one embodiment, a method of forming a line magnetoresistive random access memory (MRAM) system is provided. The method includes forming trenches in an upper layer material covering a substrate, such that the trenches expose tops of conductive islands in the substrate, depositing a conformal thin film over the trenches, such that sidewalls of the conformal thin film are formed on the trenches, and selectively etching the conformal thin film to leave individual vertical columns of the conformal thin film from the sidewalls, such that the individual vertical columns are self-aligned to and directly on top of the conductive islands below. Also, the method includes in response to depositing a filling material that leaves exposed tops of the individual vertical columns, forming a magnetic tunnel junction element on top of the filling material and the exposed tops of the individual vertical columns, and forming a plurality of line magnetoresistive random access memory devices by patterning the magnetic tunnel junction element into lines corresponding to the individual vertical columns. Each of the lines has a line magnetic tunnel junction element self-aligned to at least one of the individual vertical columns below.

According to one embodiment, a line magnetoresistive random access memory (MRAM) system is provided. The system includes conductive islands formed in a substrate, and vertical columns formed from trenches in an upper layer material. The vertical columns are self-aligned to the conductive islands. The upper layer material is on top of the substrate. The vertical columns are conductive material. Also, the system includes a filling material formed in the trenches that formed the vertical columns, where the filling material has exposed tops of the vertical columns, and a plurality of line magnetoresistive random access memory devices respectively self-aligned to the exposed tops of the vertical columns. The plurality of line magnetoresistive random access memory devices each include a line magnetic tunnel junction element self-aligned to at least one of the vertical columns below.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 12A and 12B are flow diagrams together illustrating a method of forming the line magnetoresistive random access memory (MRAM) system according to an embodiment.

DETAILED DESCRIPTION

Embodiments provide a linear magnetoresistive random access memory device/system which incorporates sidewall transfer of sidewalls as self-aligned contacts below a magnetic tunnel junction.

Magnetoresistive random access memory (MRAM) devices offer many benefits over semiconductor based memories such as dynamic random access memory (DRAM) and flash memory. However, patterning the small MRAM devices into islands of metal at the high density and uniformity desired to compete with DRAM and flash is difficult. One of the issues encountered is edge damage due to the reactive ion etch (RIE) that is typically used to subtractively pattern the MRAM device. Another issue is in making electrical contacts to the top of these small MRAM devices. A partial solution to the first issue (i.e., edge damage) is to pattern a line instead of a dot, and this reduces the edge exposure, but it does not resolve the contacting issue. Furthermore, patterning a line instead of a dot then requires a sub-feature size via contact that is difficult to pattern and align. Reliable methods of patterning magnetic lines and aligning contacts to the lines at the high density and uniformity to compete with DRAM and flash have not yet been demonstrated.

According to embodiments, a novel patterning and contacting method is proposed for linear MRAM that address both of these issues. According to an embodiment, a fabrication technique is discussed below to make a linear MRAM device. FIGS. 1 through 11 illustrate an example fabrication technique according to embodiments.

Figure 1:
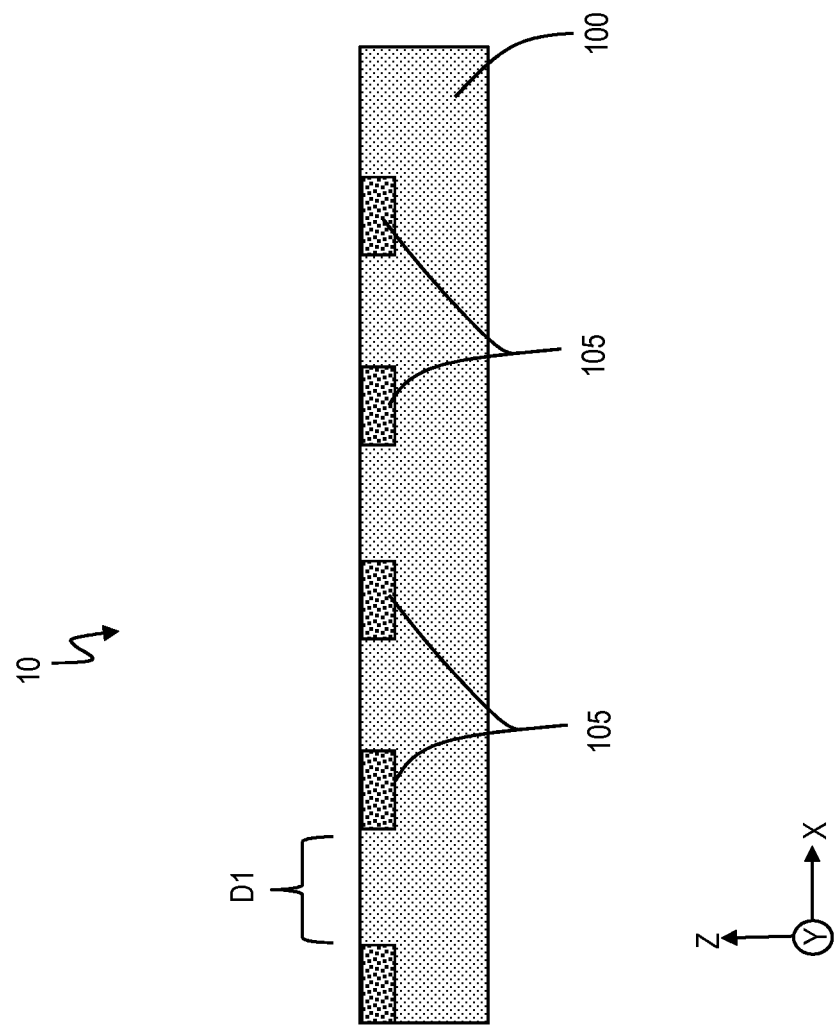
FIG. 1 is a cross-sectional view of an intermediate structure illustrating forming bottom electrodes in a substrate according to an embodiment.

Now turning to FIG. 1, a cross-sectional view is provided of an intermediate structure 10 illustrating a damascene technique for forming bottom electrodes 105 in a substrate 100. As one example to form the bottom electrodes 105, a photoresist layer (not shown) may be deposited on the substrate 100 and formed into a pattern. The pattern of the photoresist layer is etched into the substrate 100 leaving array of square like grooves in the substrate 100 in preparation to form the bottom electrodes 105, and the photoresist layer is removed. The conductive material of the bottom electrode 105 is deposited on top of substrate 100 and fills in the etched grooves of the substrate 100. The top surface of the structure 10 is planarized down to the tops of the bottom electrodes 105 using, e.g., chemical mechanical polishing (CMP), which removes any excess conductive material not in the etched grooves.

The substrate 100 may particularly be a dielectric material. In another implementation, the substrate 100 may be an insulator and/or a wafer (e.g., silicon). The conductive material of the bottom electrodes 105 may be a metal, such as copper, ruthenium, aluminum, tantalum, etc. The bottom electrodes 105 may be an array of metal islands formed within the substrate 100. The bottom electrodes 105 may be separated from one another by a distance D1 in the x-axis, and the distance D1 may range from 10-80 nanometers (nm) in one implementation.

Figure 2:
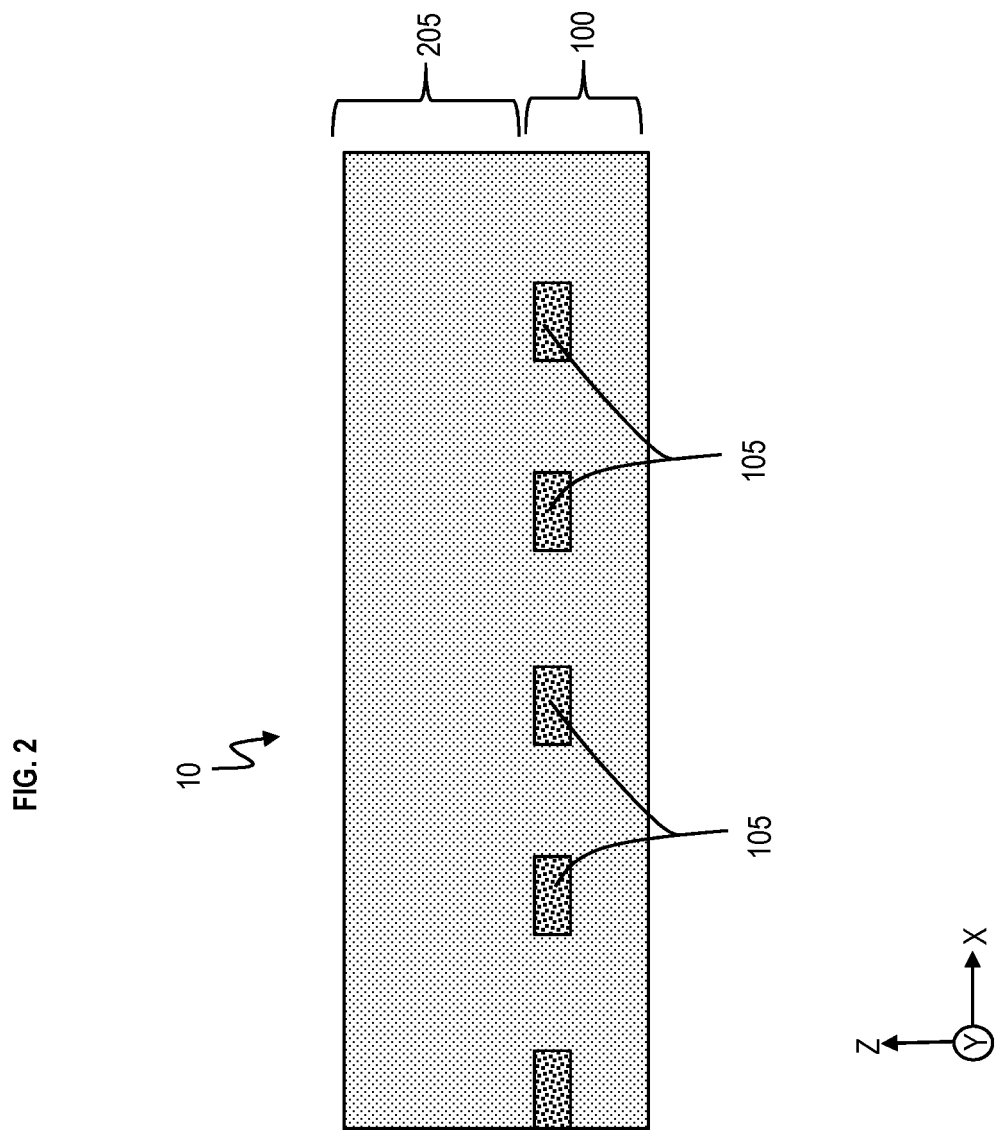
FIG. 2 is a cross-sectional view of the intermediate structure illustrating that a first upper layer has been deposited according to an embodiment.

FIG. 2 is a cross-sectional view of the intermediate structure 10 illustrating that an upper layer 205 of material has been deposited. The upper layer 205 of material is deposited on the top surface of the intermediate structure 10 covering both the substrate 100 and the bottom electrodes 105. The upper layer 205 encapsulates the bottom electrodes 105 (e.g., encapsulates the metal islands). The top surface of the upper layer 205 is planarized using, e.g., CMP.

The upper layer 205 may be a dielectric material. Also, the upper layer 205 may be an insulator. In one implementation, the upper layer 205 may be the same material as the substrate 100.

Figure 3:
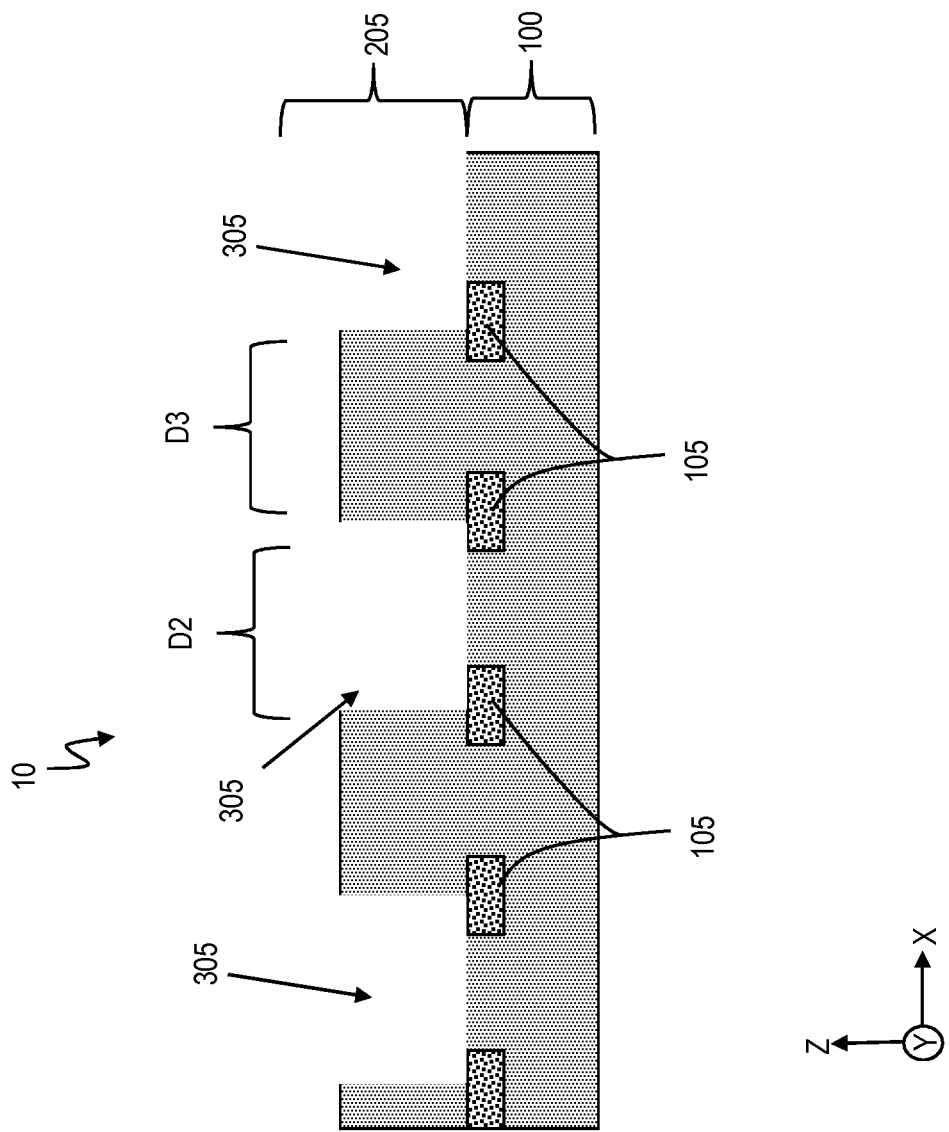
FIG. 3 is a cross-sectional view of the intermediate structure illustrating trench formation in the upper layer according to an embodiment.

FIG. 3 is a cross-sectional view of the intermediate structure 10 illustrating trench formation in the upper layer 205. As can be seen, trenches 305 have been formed in the upper layer 205. To form the trenches 305, a photoresist (not shown) may be deposited on the top of the upper layer 205 and the photoresist is patterned to define trenches therein. Using the trench patterned photoresist, the upper layer 205 is etched through so that the tops of the bottom electrodes 105 are exposed, and the patterned photoresist is removed. The trenches 305 are formed between the bottom electrodes 105 while overlapping a portion of the bottom electrodes 105. The trenches 305 are to expose a portion of the bottom electrodes 105 in anticipation of sidewall transfer, while the portion of the bottom electrodes 105 remains covered by the upper layer 205. The trenches 305 (valleys) may have a width of a distance D2 in the x-axis, and the distance D2 may be about 50-150 nm based on accommodating the separation distance D1 of the bottom electrodes 105. The width of the upper layer 205 forming the peaks between the trenches 305 is a distance D3, and the distance D3 may be about 50-150 nm.

Figure 4:
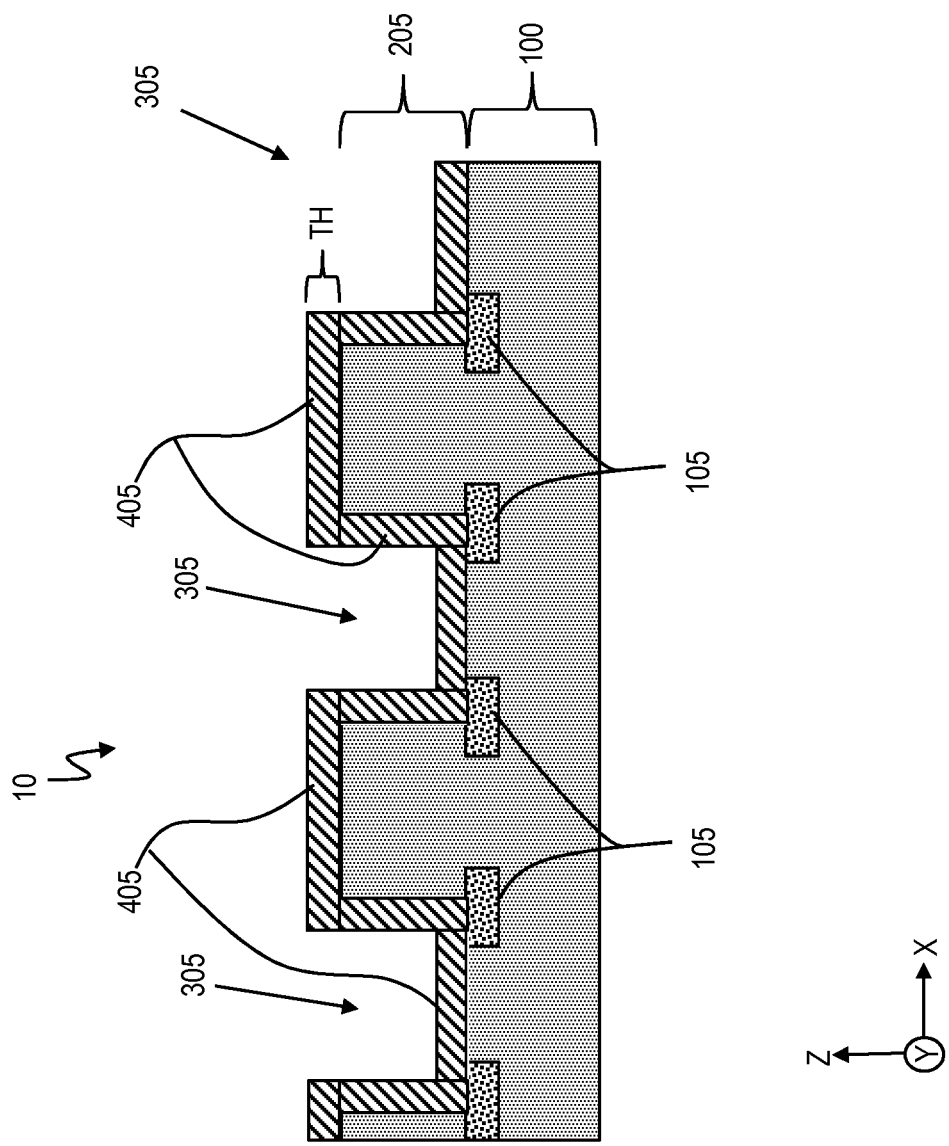
FIG. 4 is a cross-sectional view of the intermediate structure illustrating atomic layer deposition of a conformal thin film layer according to an embodiment.

FIG. 4 is a cross-sectional view of the intermediate structure 10 illustrating atomic layer deposition (ALD). A conformal thin film layer 405 may be deposited on top of the intermediate structure 10. The conformal thin film layer 405 is deposited on the bottoms and sidewalls of the trenches 305, on top of the exposed portions of the bottom electrodes 105, and on top of the upper layer 205. The conformal thin film layer 405 may be a metal such at tantalum, tantalum nitride, etc. The conformal thin film layer 405 may have a thickness (TH) of about 10-100 nm.

Figure 5:
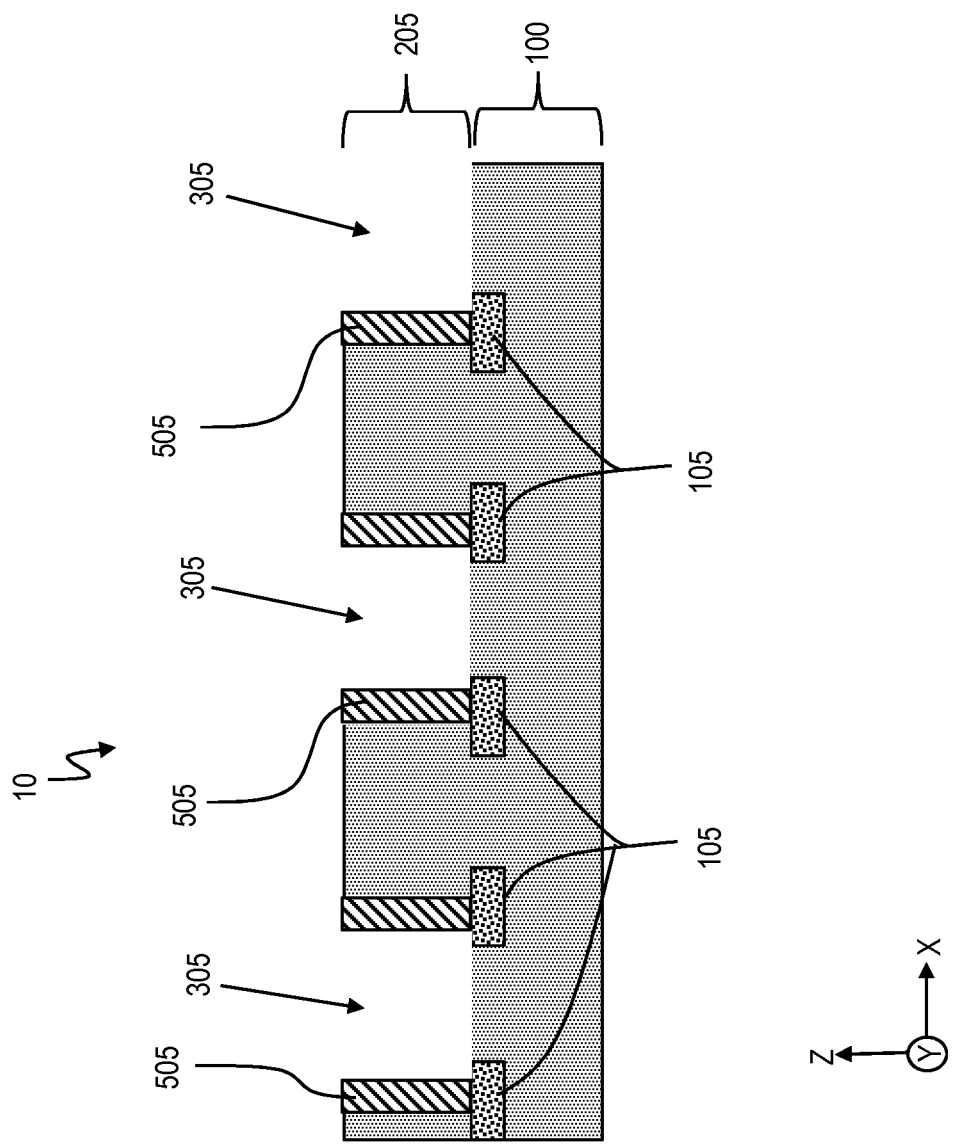
FIG. 5 is a cross-sectional view of the intermediate structure illustrating sidewall transfer according to an embodiment.

FIG. 5 is a cross-sectional view of the intermediate structure 10 illustrating sidewall transfer. FIG. 5 shows sidewalls 505 of the conformal thin film layer 405 directly on top of the bottom electrodes 105. To form the sidewalls 505, a photoresist layer may be deposited and etched into a pattern that protects the sidewalls 505 but not the other areas of the conformal thin film layer 405. The patterned photoresist is utilized to etch away some of the conductive material of the conformal thin film layer 405, while (only) leaving the sidewalls 505 remaining. The trenches 305 have a width of distance D2 in the x-axis and that distance D2 causes the walls of the trenches 305 to be directly on top of the exposed portion of the bottom electrodes 105 in FIG. 3. By having the walls of the trenches 305 directly on top of the exposed portion of the bottom electrodes 105, this forces the sidewalls 505 of the of the conformal thin film layer 405 to be directly on top of the bottom electrodes 105 in FIGS. 4 and 5, resulting in the sidewalls 505 being self-aligned to the bottom electrodes 105 as shown in FIG. 5. Selectively etching the conformal thin layer 405 on the bottom of the trench 305 and on the tops of the upper layer 205, but not the sidewalls 505 leaves the sidewalls 505 remaining.

Figure 6:
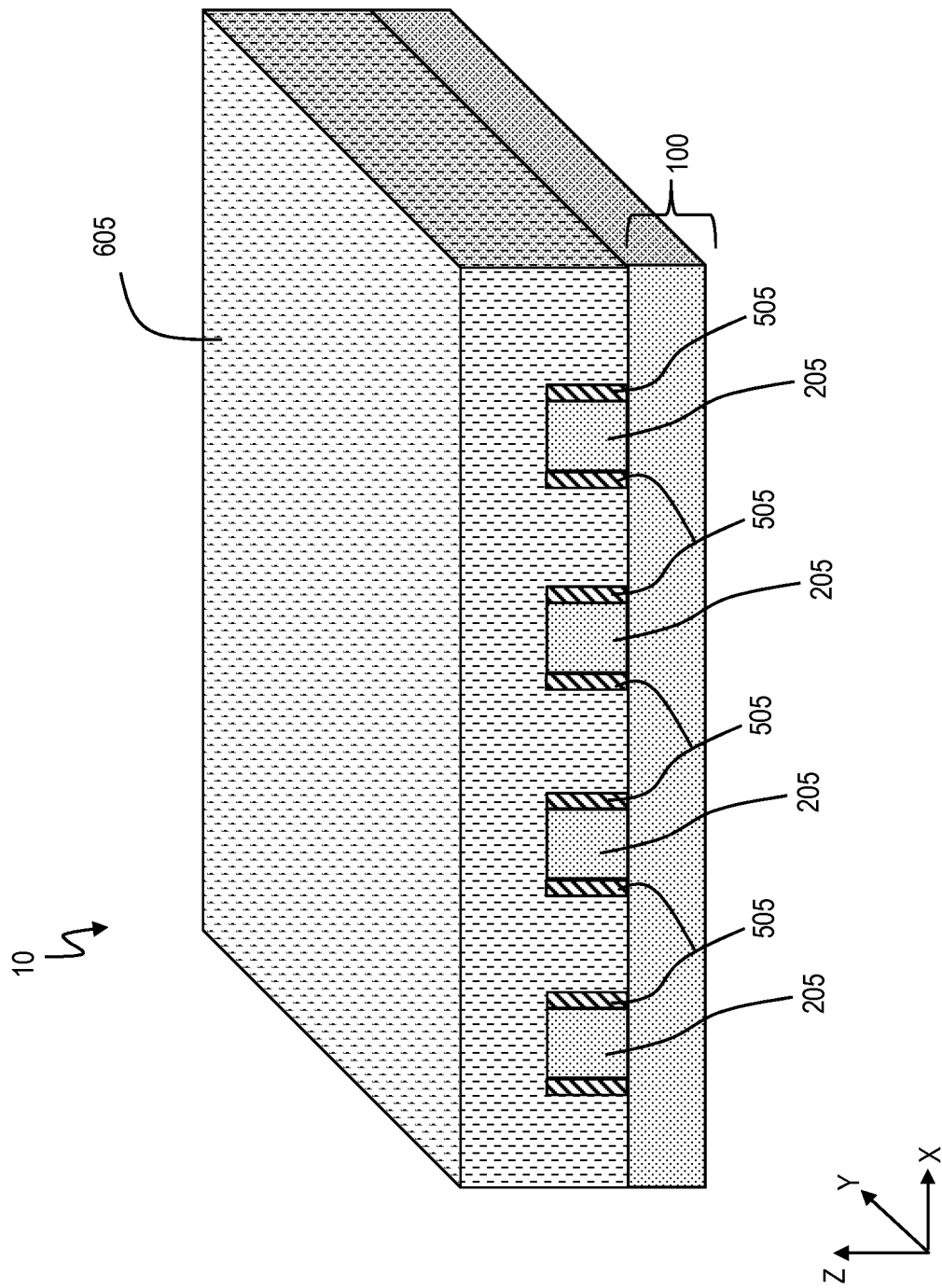
FIG. 6 is a perspective view illustrating a photoresist deposited over the top of the intermediate structure according to an embodiment.
Figure 7:
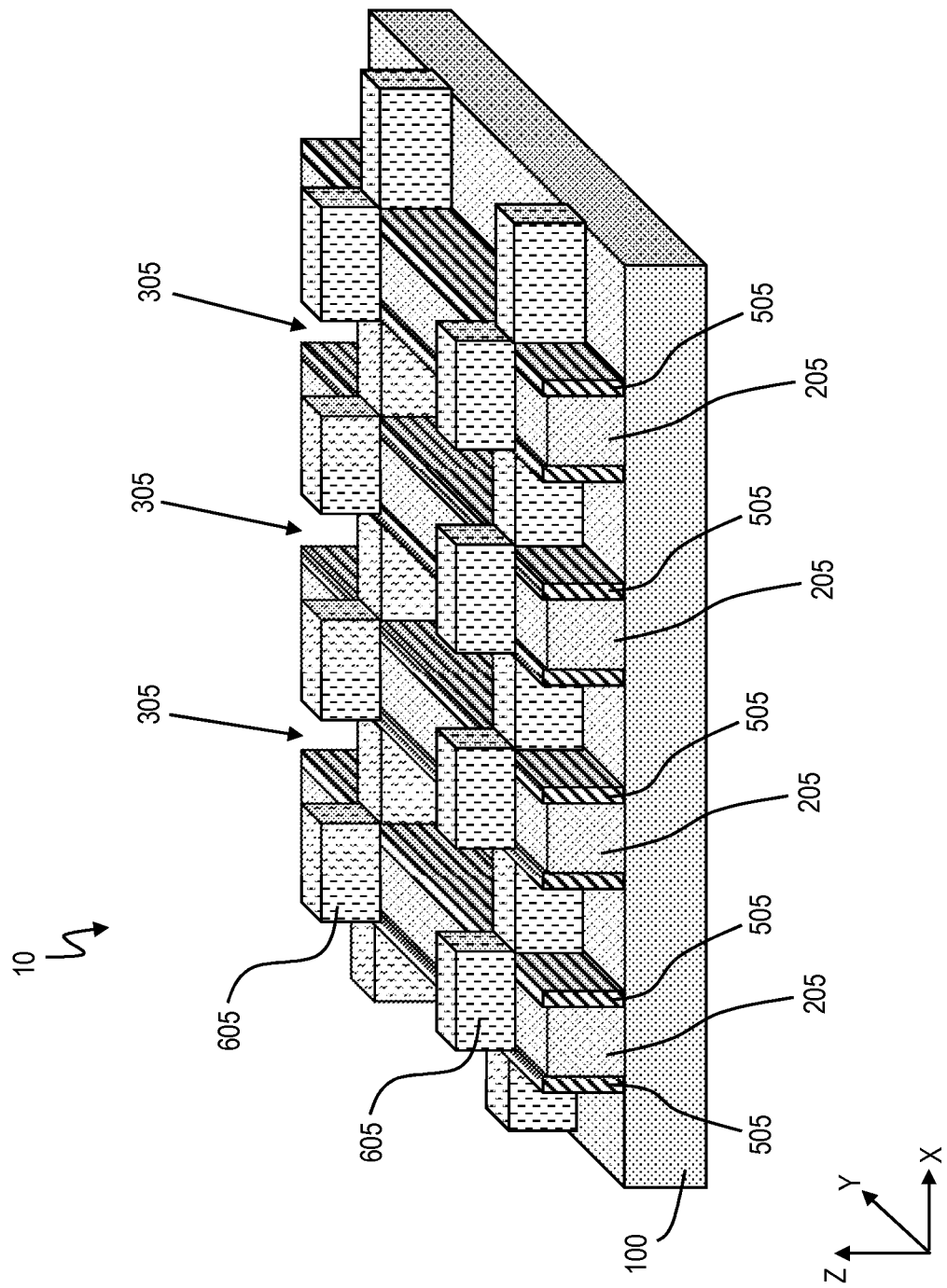
FIG. 7 is a perspective view illustrating the patterned photoresist after development according to an embodiment.

After having the sidewalls 505 remaining, FIG. 6 is a perspective view of the structure 10 illustrating a photoresist 605 deposited over the top of the intermediate structure 10. In one implementation, the photoresist 605 may be planarized (CMP) in preparation for patterning. In another implementation, the photoresist 605 may be a conformal deposition. A photolithography mask may be applied to pattern the photoresist 605 into the desired pattern. The photolithography mask has horizontal lines in the y-axis running perpendicular the trenches 305. Light (e.g., ultraviolet light) from a light source may be utilized to irradiate the uncovered parts of the photoresist 605 through the horizontal lines of the photolithography mask, and the exposed parts of the photoresist 605 are hardened by being exposed to the light, while the covered parts of the photoresist 605 are not hardened. Using wet chemistry, the unhardened parts of the photoresist 605 are etched away while the hardened parts remain as illustrated in FIG. 7. This example has been explained for a positive photoresist 605, but it is understood that the process can be adapted for a negative photoresist as understood by one skilled in the art.

After etching away parts of the photoresist 605 that were not exposed to the light, FIG. 7 is a perspective view of the intermediate structure 10 illustrating the remaining (patterned) photoresist 605. The photoresist 605 is now formed into lines corresponding to the horizontal lines in the photolithography mask. The lines of the photoresist 605 have some raised portions assuming a conformal deposition. The remaining photoresist 605 is self-aligned isolated pillars that correspond to locations of the bottom electrodes 105 (not shown in FIG. 7) in the substrate 100. The lines of photoresist 605 are positioned to protect areas of the sidewalls 505 in contact with the bottom electrodes 105 underneath, while the unprotected areas of the sidewalls 505 can be removed.

Figure 8:
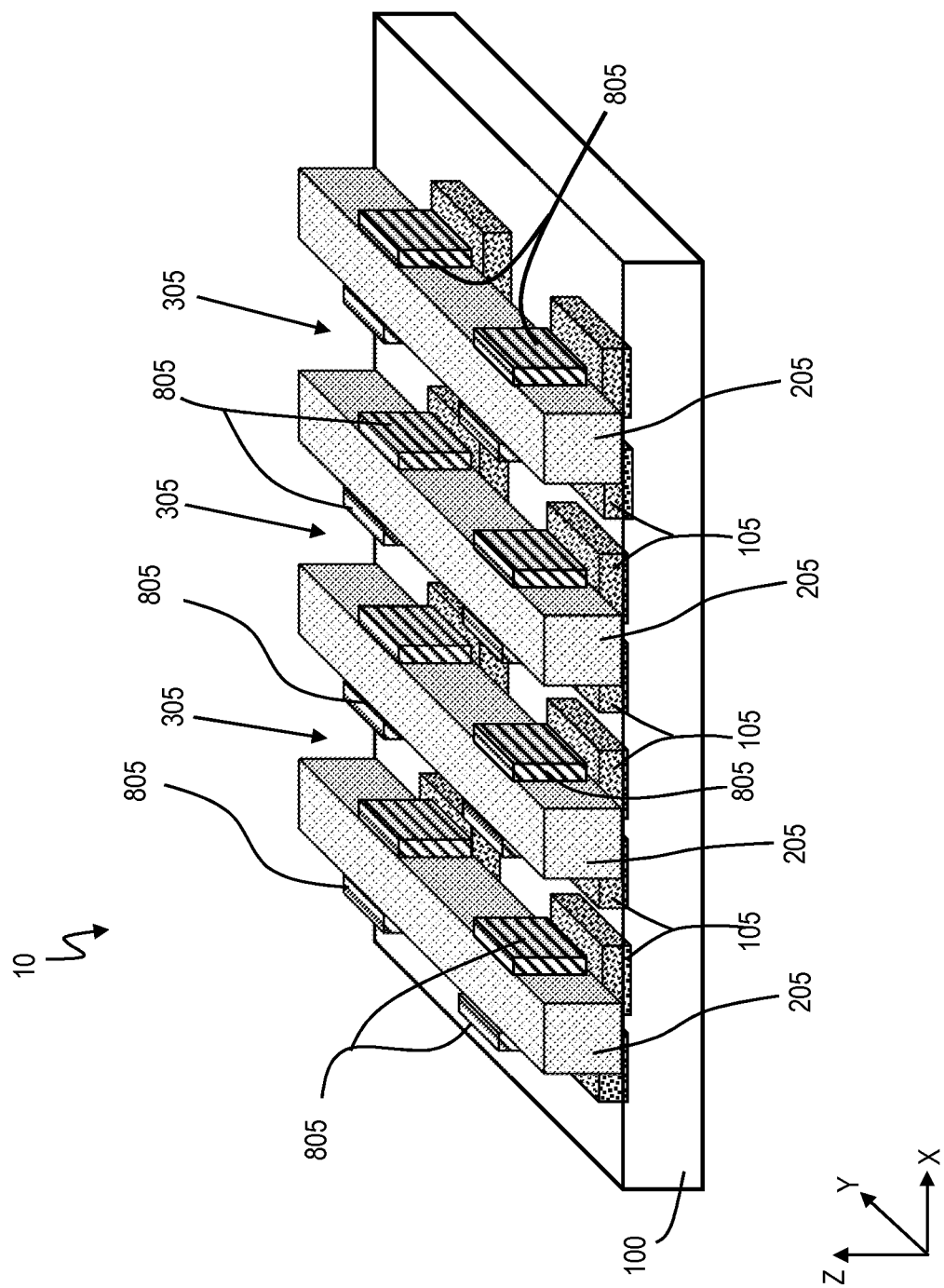
FIG. 8 is a perspective view illustrating individual vertical columns formed after removing portions by etching of the sidewalls according to an embodiment.

FIG. 8 is a perspective view of the intermediate structure 10 after removing the unprotected areas of the sidewalls 505 and then later removing the lines of photoresist 605. In FIG. 8, the substrate 100 is shown as semi-transparent such that the bottom electrodes 105 (i.e., conductive islands) can be seen embedded within the substrate 100. FIG. 8 shows that individual vertical columns 805 (formed from the sidewalls 505 of conformal thin layer 405) are directly on top of and self-aligned to the bottom electrodes 105. The individual vertical columns 805 are on the walls of the trenches 305.

Figure 9:
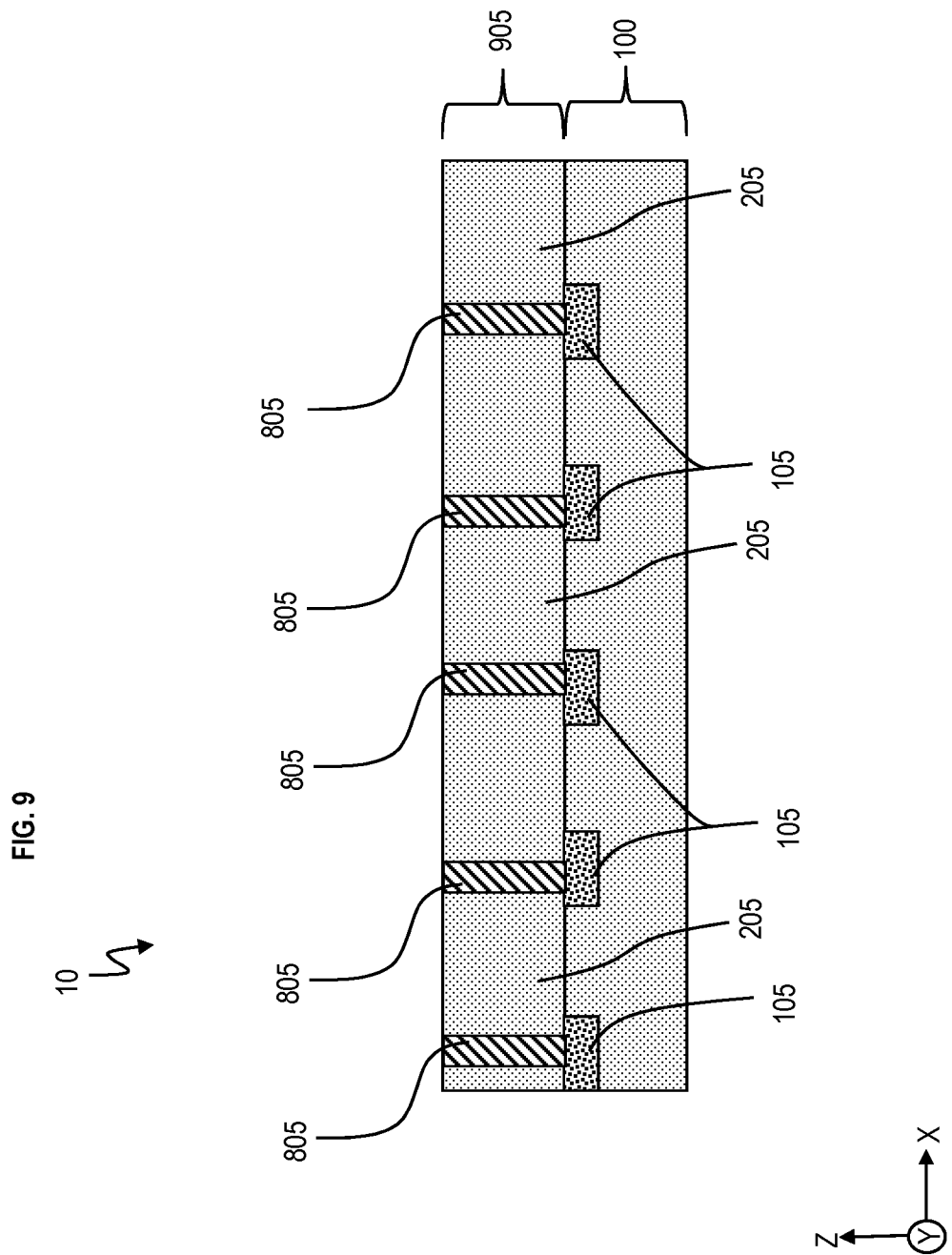
FIG. 9 is a cross-sectional view illustrating that a second upper layer is deposited on the top surface of the intermediate structure according to an embodiment.

FIG. 9 is a cross-sectional view of the intermediate structure 10 illustrating that a second upper layer 905 of material is deposited on the top surface of the structure 10 and then planarized (CMP) to expose the tops of the individual vertical columns 805 (previously the sidewalls 505 of conformal thin layer 405). The material of the second upper layer 905 may be a dielectric material, an insulator, etc. The second upper layer 905 may be the same material as the first upper layer 205 and/or the substrate 100. The second upper layer 905 may be referred to as filling material because the second upper layer 905 fills in the trenches 305.

FIG. 9 also shows that individual vertical columns 805 (formed from the sidewalls 505 of conformal thin layer 405) are directly on top of and self-aligned to the bottom electrodes 105.

The individual vertical columns 805 may be considered bottom contacts, conducting vias, etc., which are designed to be in contact with and self-aligned to the bottom electrodes 105 below.

Figure 10:
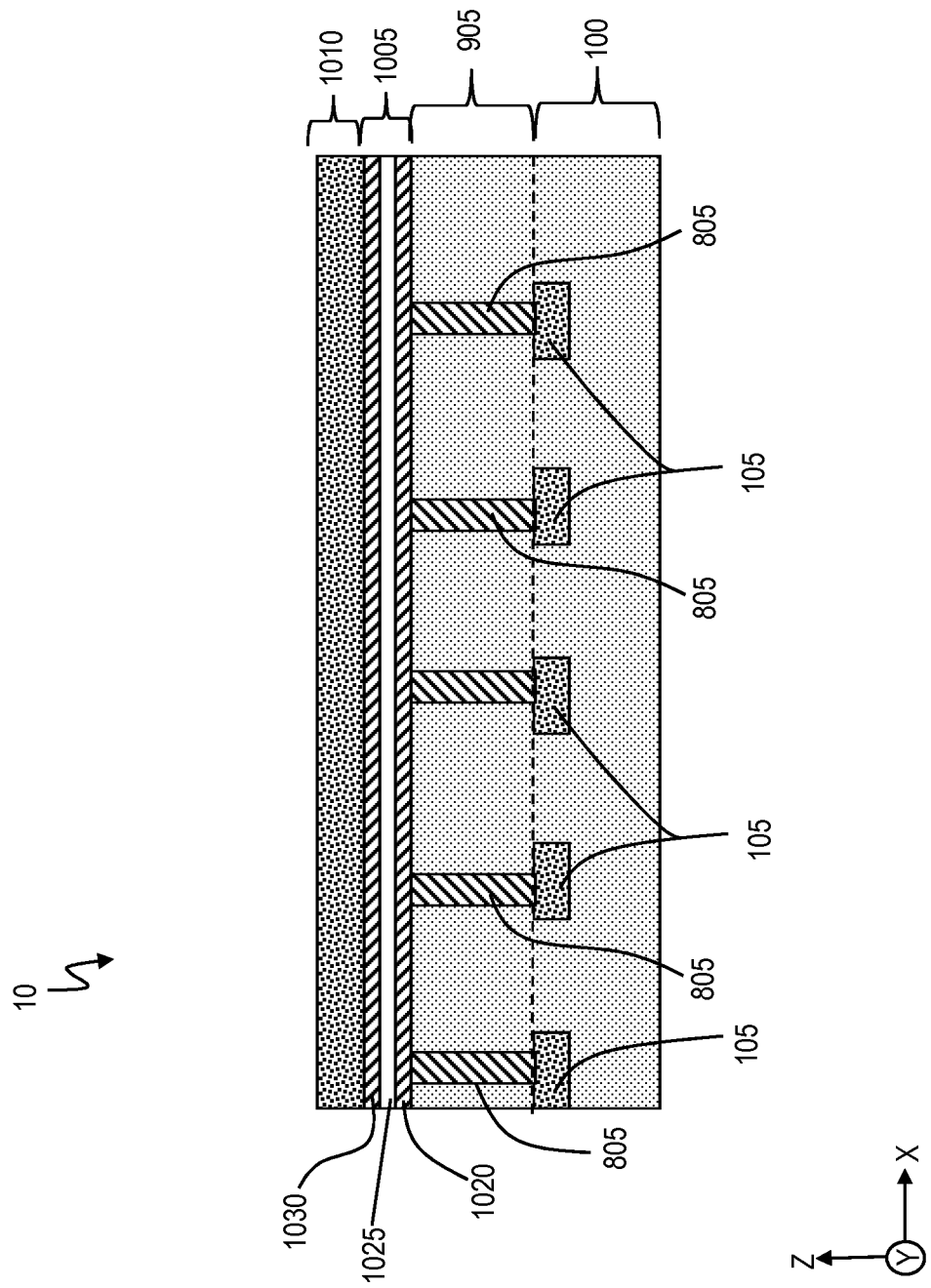
FIG. 10 is a cross-sectional view illustrating blanket deposition of a magnetic tunnel junction (MTJ) element and top electrode on the intermediate structure according to an embodiment.

FIG. 10 is a cross-sectional view of the intermediate structure 10 illustrating blanket deposition of a magnetic tunnel junction (MTJ) element 1005 and a top electrode 1010 (or top contact) on top of the MTJ element 1005. The magnetic tunnel junction element 1005 includes a free (magnetic) layer 1020 (on top of the second upper layer 905 and vertical columns 805), a non-magnetic tunnel barrier layer 1025, and a reference (magnetic) layer 1030 (also called a fixed layer). In one implementation, the free layer 1020 and the reference layer 1030 may be switched such that the reference layer 1030 is deposited on top of the second upper layer 905 and vertical columns 805, the non-magnetic tunnel barrier layer 1025 is deposited on top of reference layer 1030, and the free layer 1020 is deposited on top of the non-magnetic tunnel barrier layer 1025.

Figure 11A:
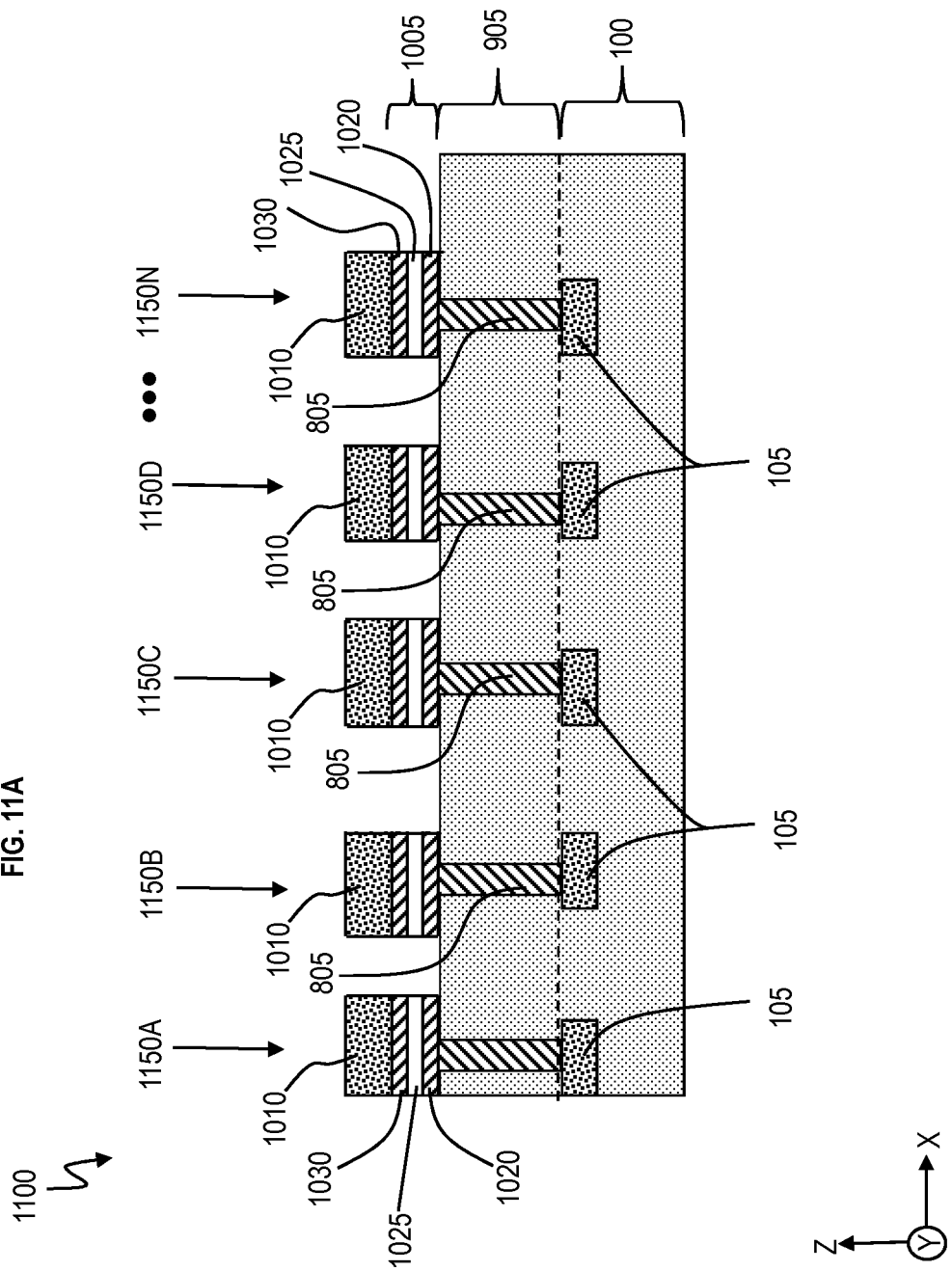
FIG. 11A is a cross-sectional view of a line magnetoresistive random access memory (MRAM) system, after patterning the magnetic tunnel junction element and top electrode according to an embodiment.
Figure 11B:
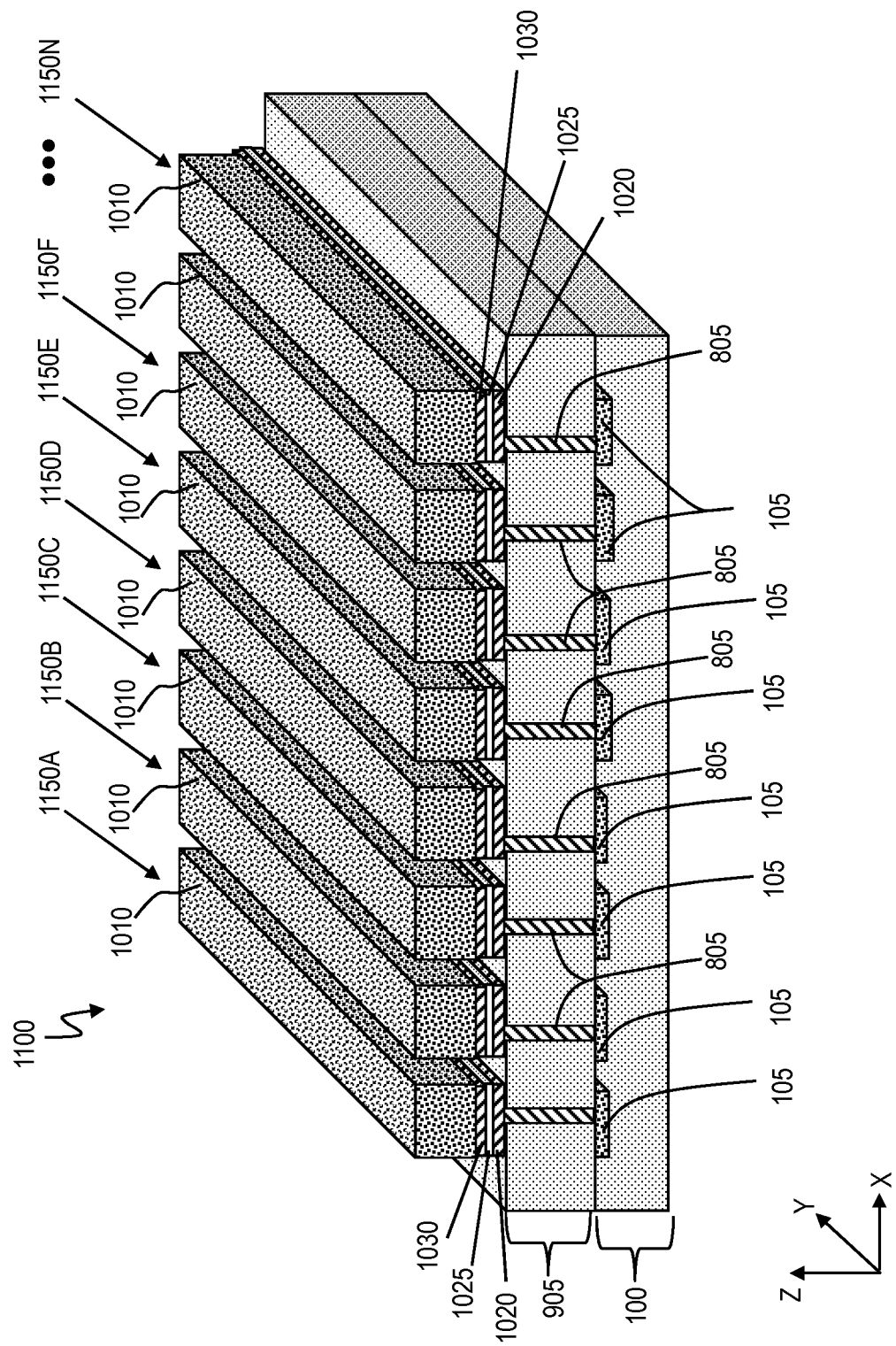
FIG. 11B is a perspective view of the line magnetoresistive random access memory (MRAM) system according to an embodiment.

FIG. 11A is a cross-sectional view and FIG. 11B is a perspective view illustrating patterning the magnetic tunnel junction (MTJ) element 1005 and the top electrode 1010, while stopping the etch at the second upper layer 905. As one option of patterning the magnetic tunnel junction element 1005 and the top electrode 1010, a photoresist layer may be deposited on top of the top contact layer 1010 and the photoresist layer is etched into lines extending in the y-axis. The patterned photoresist is utilized to then etch the magnetic tunnel junction element 1005 and the top electrode 1010 while stopping at the second upper layer 905. Then, the patterned photoresist is removed.

After patterning the magnetic tunnel junction (MTJ) element 1005 and the top electrode 1010, the result structure is the line magnetoresistive random access memory (MRAM) system 1100 that comprises a plurality of line magnetoresistive random access memory (MRAM) devices 1150A through 1150N, where N is the last line MRAM device. The line extends along the y-axis. Each line magnetoresistive random access memory device 1150A through 1150N has its own MTJ element 1005 (i.e., patterned MTJ stack) and optionally has its own top electrode 1010, vertical column 805 (conducting via, bottom contact) directly under the MTJ element 1005, and bottom electrode 105 directly under the vertical column 805.

The free layer 1020 is configured to have its magnetization flipped in a first direction or second direction, while the reference layer 1030 is configured to have its magnetization fixed as understood by one skilled in the art. The resistance is low (e.g., 1) when the magnetization of the free layer 1020 is parallel to the magnetization of the reference layer 1030. The resistance is high (e.g., 0) when the magnetization of the free layer 1020 is antiparallel to the magnetization of the reference layer 1030.

In one implementation, each line magnetoresistive random access memory device 1150A through 1150N is configured to store its own bit, e.g., 1 (parallel) or 0 (antiparallel), based on the relationship between the free layer 1020 and reference layer 1030. In this implementation, the magnetization of the free layer 1020 for the entire length of the line magnetoresistive random access memory device 1150A through 1150N is configured to switch as a whole to be parallel or antiparallel to the magnetization of the reference layer 1030.

In another implementation, each line magnetoresistive random access memory device 1150A through 1150N is configured to store more than one bit by having domain walls (not shown) in the free layer 1020 in which the domain walls create up two or more domains. Each domain corresponds to a bit and has a high or low resistance based on the relationship between the particular domain of the free layer 1020 and reference layer 1030.

Figure 12A:
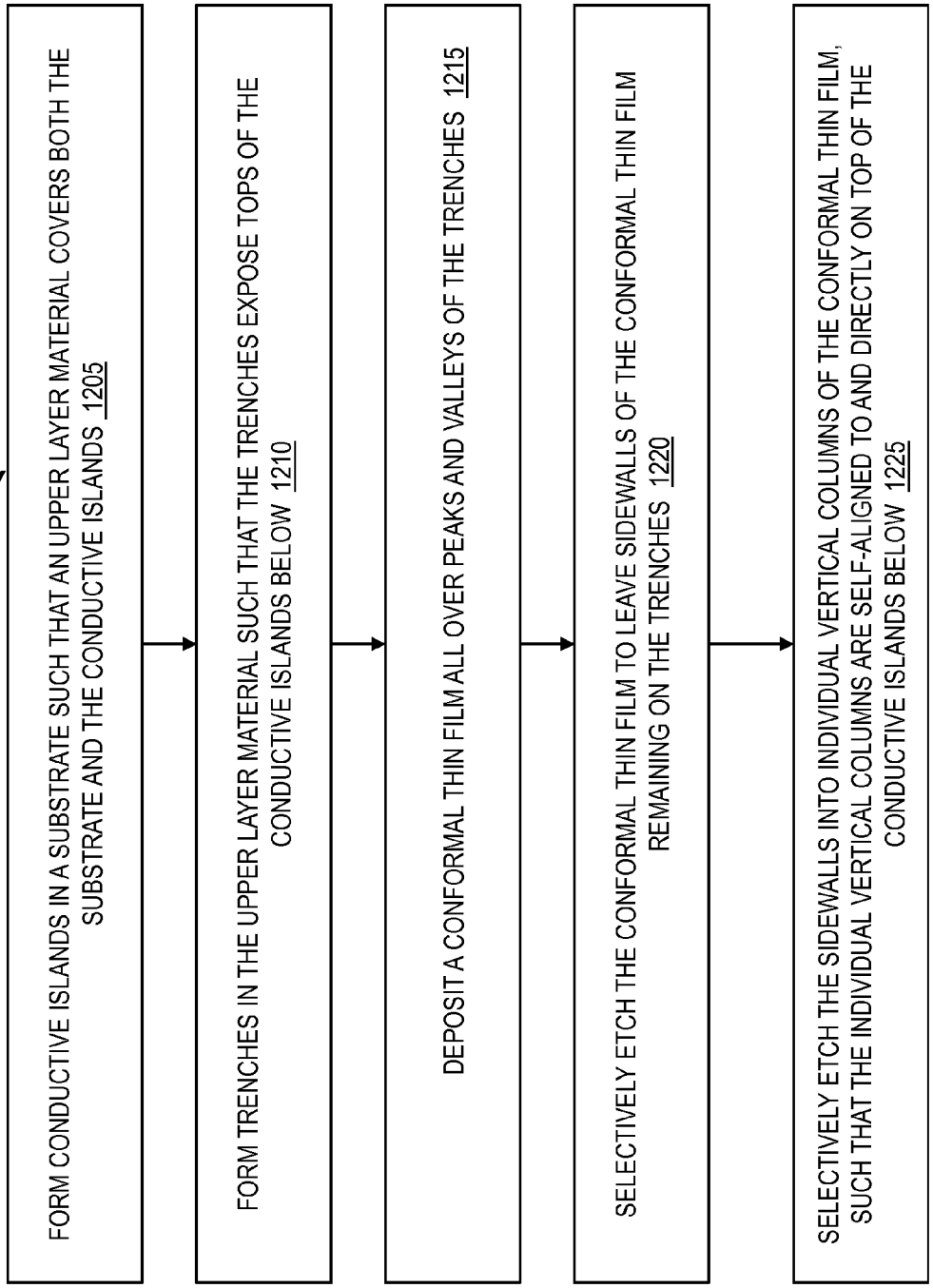

Now turning to FIGS. 12A and 12B, a method 1200 is provided of forming the line magnetoresistive random access memory (MRAM) system 1100 according to an embodiment.

At block 1205, conductive islands 105 are formed in the substrate such that an upper layer material 205 covers both the substrate 100 and the conductive islands 105, as illustrated in FIGS. 1 and 2.

At block 1210, trenches 305 are formed in the upper layer material 205 such that the trenches 305 expose tops of the conductive islands 105 below, as illustrated in FIG. 3.

At block 1215, a conformal thin film 405 is deposited all over peaks and valleys of the trenches 305, as illustrated in FIG. 4.

At block 1220, the conformal thin film 405 selectively etched to leave sidewalls 505 of the conformal thin film 405 remaining on walls of the trenches 305, as illustrated in FIG. 5.

At block 1225, the sidewalls 505 are selectively etched into individual vertical columns 805 of the conformal thin film 405, such that the individual vertical columns 805 are self-aligned to and directly on top of the conductive islands 105 below, as illustrated in FIG. 9.

At block 1230, a filling material 905 (also referred to as the second upper layer 905) is deposited, and the filling material 905 is planarized to leave exposed tops of the individual vertical columns 805, as illustrated in FIG. 9.

At block 1235, a magnetic tunnel junction element 1005 is formed on top of the planarized filling material 905 and the exposed tops of the individual vertical columns 805, as illustrated in FIG. 10.

At block 1240, the magnetic tunnel junction element 1005 is patterned into lines corresponding to locations the individual vertical columns 805, and each of the lines has a line magnetic tunnel junction element 1005 self-aligned to at least one of the individual vertical columns 805 below, as illustrated in FIGS. 11A and 11B.

At block 1245, a plurality of line magnetoresistive random access memory devices 1150A-N are formed by patterning the magnetic tunnel junction element 1005 into the lines, where each of the plurality of line magnetoresistive random access memory devices 1150A-N respectively includes the line magnetic tunnel junction element 1005 self-aligned to the at least one of the individual vertical columns 805.

Additionally, a top contact layer 1010 is formed on top of the magnetic tunnel junction element 1005, illustrated in FIG. 10. Patterning the magnetic tunnel junction element 1005 into the lines corresponding to the individual vertical columns 805 includes patterning the top contact layer 1010 into line top contacts such that each of the lines includes a line top contact of the line top contacts on top of the line magnetic tunnel junction element 1005, as illustrated in FIG. 11A.

In one implementation, each of the plurality of line magnetoresistive random access memory devices 1150A-N respectively includes the line top contact 1010 on top of the line magnetic tunnel junction element 1005.

Further, in another implementation, each of the plurality of line magnetoresistive random access memory devices 1150A-N respectively includes the line top contact 1010 on top of the line magnetic tunnel junction element, at least one of the individual vertical columns 805, and at least one of the conductive islands 105.

The line magnetic tunnel junction element 1005 includes a non-magnetic tunnel barrier 1025 sandwiched by a first magnetic layer and a second magnetic layer. The first magnetic layer 1020 is on top of the planarized filling material 905 and the at least one of the individual vertical columns 805, the non-magnetic tunnel barrier 1025 is on top of the first magnetic layer 1020, and the second magnetic layer 1030 is on top of the non-magnetic tunnel barrier 1025.

In one implementation, the first magnetic layer is a free layer and the second magnetic layer is the reference layer. In another implementation, the first magnetic layer is a reference layer and the second magnetic layer is a free layer.

The sidewalls 505 of the conformal thin film 405 are vertical. The individual vertical columns 805 of the conformal thin film 405 correspond to a vertical orientation of the sidewalls 505.

Selectively etching the sidewalls 505 into the individual vertical columns 805 of the conformal thin film 405, such that the individual vertical columns 805 are self-aligned to and directly on top of the conductive islands 105 below, includes:

1) Depositing a photoresist 605 on top of sidewalls as well as on top of the peaks and the valleys of the trenches, as illustrated in FIG. 6.

2) Patterning the photoresist 605 into horizontal lines that are perpendicular to the trenches 305, where the horizontal lines of the photoresist protect the portions of the sidewalls 505 that are to be the individual vertical columns 805 of the conformal thin film 405.

3) Selectively etching away unprotected sidewalls 505 to leave the individual vertical columns 805 of the conformal thin film 405.

The horizontal lines of the photoresist cross over locations of the conductive islands 105, such that respective ones of the individual vertical columns 805 remaining after etching are self-aligned to respective ones of the conductive islands 105.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution.

After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A line magnetoresistive random access memory (MRAM) system, the system comprising:
   conductive islands formed in a substrate;
   vertical columns formed from trenches in an upper layer material, the vertical columns being self-aligned to the conductive islands, wherein the upper layer material is on top of the substrate, and wherein the vertical columns are conductive material;
   a filling material formed in the trenches that formed the vertical columns, the filling material has exposed tops of the vertical columns; and
   a plurality of line magnetoresistive random access memory devices respectively self-aligned to the exposed tops of the vertical columns, the plurality of line magnetoresistive random access memory devices each including a line magnetic tunnel junction element self-aligned to at least one of the vertical columns below;
   wherein each of the vertical columns has a height such that a top of each of the vertical columns contacts the plurality of line magnetoresistive random access memory devices and a bottom of each of the vertical columns contacts the conductive islands; and
   wherein a width of each of the vertical columns is consistent throughout the height of each of the vertical columns.

2. The system of claim 1, wherein a top contact layer is formed on top of the line magnetic tunnel junction element.

3. The system of claim 1, wherein the line magnetic tunnel junction element includes a non-magnetic tunnel barrier sandwiched by a first magnetic layer and a second magnetic layer.

4. The system of claim 3, wherein the first magnetic layer is on top of the filling material.

5. The system of claim 4, wherein the non-magnetic tunnel barrier is on top of the first magnetic layer.

6. The system of claim 5, wherein the second magnetic layer is on top of the non-magnetic tunnel barrier.

7. The system of claim 3, wherein the first magnetic layer is a free layer.

8. The system of claim 7, wherein the second magnetic layer is a reference layer.

9. The system of claim 1, wherein the plurality of line magnetoresistive random access memory devices extend along a first axis.

10. The system of claim 1, wherein one line magnetic tunnel junction element is configured to individually contact one of the conductive islands via one of the vertical columns.

11. The system of claim 10, wherein the one of the conductive islands is directly under the one of the vertical columns:
    wherein the filling material has a top planar surface, such that each of the plurality of line magnetoresistive random access memory devices is adjacent to the top planar surface.

12. The system of claim 10, wherein another line magnetic tunnel junction element is configured to individually contact another one of the conductive islands via another one of the vertical columns.

13. The system of claim 12, wherein the another one of the conductive islands is directly under the another one of the vertical columns.

14. The system of claim 1, wherein the plurality of line magnetoresistive random access memory devices is each configured to store its own bit.

15. The system of claim 14, wherein the plurality of line magnetoresistive random access memory devices is each configured to store at 1 or 0.

16. The system of claim 14, wherein each of the plurality of line magnetoresistive random access memory devices is configured to store 1 bit.

17. The system of claim 16, wherein based on each of the plurality of line magnetoresistive random access memory devices being configured to store 1 bit, a magnetization along an entire length is configured to be switched as a whole to be parallel or antiparallel.

18. The system of claim 14, wherein each of the plurality of line magnetoresistive random access memory devices is configured to store more than 1 bit.

19. The system of claim 18, wherein based on each of the plurality of line magnetoresistive random access memory devices being configured to store more than 1 bit, an entire length is not configured to be switched as a whole to be parallel or antiparallel.

20. The system of claim 19, wherein each of the plurality of line magnetoresistive random access memory devices has domain walls that create more than 1 domain.

* * * * *